(12) United States Patent  
Tilton et al.

(10) Patent No.: US 7,313,925 B1  
(45) Date of Patent: Jan. 1, 2008

(54) ATOMIZER FOR THERMAL MANAGEMENT SYSTEM

(75) Inventors: Charles L. Tilton, Colton, WA (US); Jeff Weiler, Liberty Lake, WA (US); Randal T. Palmer, Liberty Lake, WA (US); Philip W. Appel, Liberty Lake, WA (US); Paul A. Knight, Spokane, WA (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 441 days.

(21) Appl. No.: 10/861,333

(22) Filed: Jun. 3, 2004

Related U.S. Application Data (60) Provisional application No. 60/475,631, filed on Jun. 3, 2003.

(51) Int. Cl.  
*F25D 23/12* (2006.01)  
*B05B 1/30* (2006.01)

(52) U.S. Cl. .................. 62/259.2; 62/373; 239/69; 239/75; 239/583; 239/585.1

(58) Field of Classification Search ........... 239/473, 239/583, 584, 585.1, 585.4, 585.5, 596, 69, 239/75; 62/259.2, 171, 304, 373, 376  
See application file for complete search history.

(56) References Cited

U.S. PATENT DOCUMENTS

| 5,108,037 A | 4/1992 | Okamoto et al. |
| 5,220,804 A | 6/1993 | Tilton et al. |
| 5,713,327 A | 2/1998 | Tilton et al. |
| 5,740,967 A * | 4/1998 | Simmons et al. ........... 239/596 |
| 6,016,969 A | 1/2000 | Tilton et al. |
| 6,108,201 A | 8/2000 | Tilton et al. |
| 6,983,900 B2 * | 1/2006 | Dantes et al. ............ 239/585.1 |

* cited by examiner

*Primary Examiner*—Steven J. Ganey  
(74) *Attorney, Agent, or Firm*—Michael S. Neustel (57) ABSTRACT

An atomizer for thermal management system for efficiently thermally managing one or more heat producing devices. The atomizer for thermal management system includes a housing having a coolant passage and a dispensing end, an orifice within the dispensing end, and an actuator manipulating a plunger within the housing. The plunger includes a head that is sealable within a recessed portion of the orifice to open or close the orifice. The coolant passes through the coolant passage into the orifice for spraying upon a heat producing device. The actuator may reciprocate so that the coolant spray emitted through the orifice is pulsating. The pulsing frequency may be increased to increase cooling or decreased to decrease cooling of the heat producing device.

23 Claims, 9 Drawing Sheets

ATOMIZER FOR THERMAL MANAGEMENT SYSTEM

CROSS REFERENCE TO RELATED APPLICATIONS

I hereby claim benefit under Title 35, United States Code, Section 119(e) of U.S. provisional patent application Ser. No. 60/475,631 filed Jun. 3, 2003. I also hereby claim benefit under Title 35, United States Code, Section 120 of U.S. patent application Ser. No. 10/281,391 filed Oct. 24, 2002 and U.S. patent application Ser. No. 10/280,240 filed Oct. 22, 2002 The 60/475,631, 10/281,391 and 10/280,240 applications are hereby incorporated by reference into this application.

STATEMENT REGARDING FEDERALLY SPONSORED RESEARCH OR DEVELOPMENT

The U.S. Government has certain rights to this invention under NASA Contract No. NAAS8-40644.

BACKGROUND OF THE INVENTION

1. Field of the Invention

The present invention relates generally to atomizers and more specifically it relates to an atomizer for thermal management system for efficiently thermally managing one or more heat producing devices.

2. Description of the Related Art

Modern electronic devices (e.g. microprocessors, circuit boards, power supplies and other electronic devices) have increased thermal management requirements. Conventional dry thermal management technology (e.g. fans, vents) simply is not capable of efficiently cooling modern high-end electronics. Spray cooling technology is being adopted today as the most efficient option for thermally managing electronic systems. U.S. Pat. No. 5,220,804 entitled High Heat Flux Evaporative Spray Cooling to Tilton et al. describes the earlier versions of spray technology. U.S. Pat. No. 6,108,201 entitled Fluid Control Apparatus and Method for Spray Cooling to Tilton et al. also describes the usage of spray technology to cool a printed circuit board. Spray thermal management may be performed locally (i.e. where the chip is sprayed directly), globally (i.e. where the chip and surrounding electronics/boards are also sprayed), a combination of locally and globally, or in conjunction with air cooling or other cooling methods.

Atomizers have been utilized for years within conventional spray cooling technologies for dispensing the liquid coolant as a fine spray upon one or more heat producing devices. A conventional atomizer typically is comprised of a housing with an orifice extend into the housing for dispensing the coolant in a fine spray onto the heat producing device. The orifice may be formed to various sizes and shapes to achieve a predetermined spray pattern and flow rate. U.S. Pat. Nos. 5,713,327 and 6,016,969 to Tilton are examples of alternative atomizers referred to as pressure swirl atomizers. A doctoral dissertation entitled "Spray Cooling" by Donald Tilton, 1989 (available through the University of Kentucky library system) describes how droplet size and momentum can create thin evaporative films capable of absorbing high heat fluxes. Generally, the thinner the film the greater the critical heat flux (CHF). If the dispensed droplets do not have sufficient momentum, they will be entrained by the vapor created by the thin-film and not contribute to cooling. If the dispensed droplets have too much momentum, they may cause splashing of the cooling surface.

One of the problems with conventional atomizers is that they do not allow for direct control of the coolant flow at the atomizer. The coolant flow through the orifice of a conventional atomizer is typically controlled by valves positioned between the atomizer and the pump. Hence, there is a specific volume and momentum of coolant contained within the conduit between the valve and the atomizer. The distance between the valve and atomizer creates unwanted system delay.

Another problem with conventional atomizers is that the coolant flow rate through each individual atomizer is controlled solely by the pressure of the coolant. The pressure can be controlled throughout the entire system through pump controls and valve controls; however the pressure cannot be easily controlled for each individual atomizer. Controlling atomizer pressures creates non-optimal droplet momentums; momentums necessary for high CHF's.

Another problem with conventional atomizers is that they are typically designed for a specific application and thermal management system. Conventional atomizers typically cannot be utilized in other thermal management system. In addition, if the characteristics of the heat producing device are changed requiring additional or reduced thermal management in specific locations, conventional atomizers do not provide the flexibility required to adjust accordingly.

A further problem with conventional atomizers is that they emit a constant spray upon the heat producing device. This constant spray upon the heat producing device may "flood" the surface of the heat producing device thereby reducing the thermal management efficiency during spray cooling.

Hence, there is a need for an atomizer for a spray cooling thermal management system that is individually controllable and that provides the flexibility required to thermally manage modern electronic devices.

BRIEF SUMMARY OF THE INVENTION

In view of the foregoing disadvantages inherent in the known types of atomizers now present in the prior art, the present invention provides a new atomizer for thermal management system construction wherein the same can be utilized for efficiently thermally managing one or more heat producing devices.

The general purpose of the present invention, which will be described subsequently in greater detail, is to provide a new atomizer for thermal management system that has many of the advantages of the atomizers mentioned heretofore and many novel features that result in a new atomizer for thermal management system which is not anticipated, rendered obvious, suggested, or even implied by any of the prior art atomizers, either alone or in any combination thereof.

To attain this, the present invention generally comprises a housing having a coolant passage and a dispensing end, an orifice within the dispensing end, and an actuator manipulating a plunger within the housing. The plunger includes a head that is sealable within a recessed portion of the orifice to open or close the orifice. The coolant passes through the coolant passage into the orifice for spraying upon a heat producing device. The actuator may reciprocate so that the coolant spray emitted through the orifice is pulsating. The pulsing frequency may be increased to increase cooling or decreased to decrease cooling of the heat producing device.

There has thus been outlined, rather broadly, the more important features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide an atomizer for thermal management system that will overcome the shortcomings of the prior art devices.

A second object is to provide an atomizer for thermal management system for efficiently thermally managing one or more heat producing devices.

Another object is to provide an atomizer for thermal management system that is individually controllable.

An additional object is to provide an atomizer for thermal management system that allows for the thermal management of a heat producing device that has varying heat fluxes.

Yet another object is to provide an atomizer for thermal management system that allows for the thermal management of a heat producing device that produces a high heat flux.

A further object is to provide an atomizer for thermal management system that may be utilized in various thermal management systems.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Figure 4:
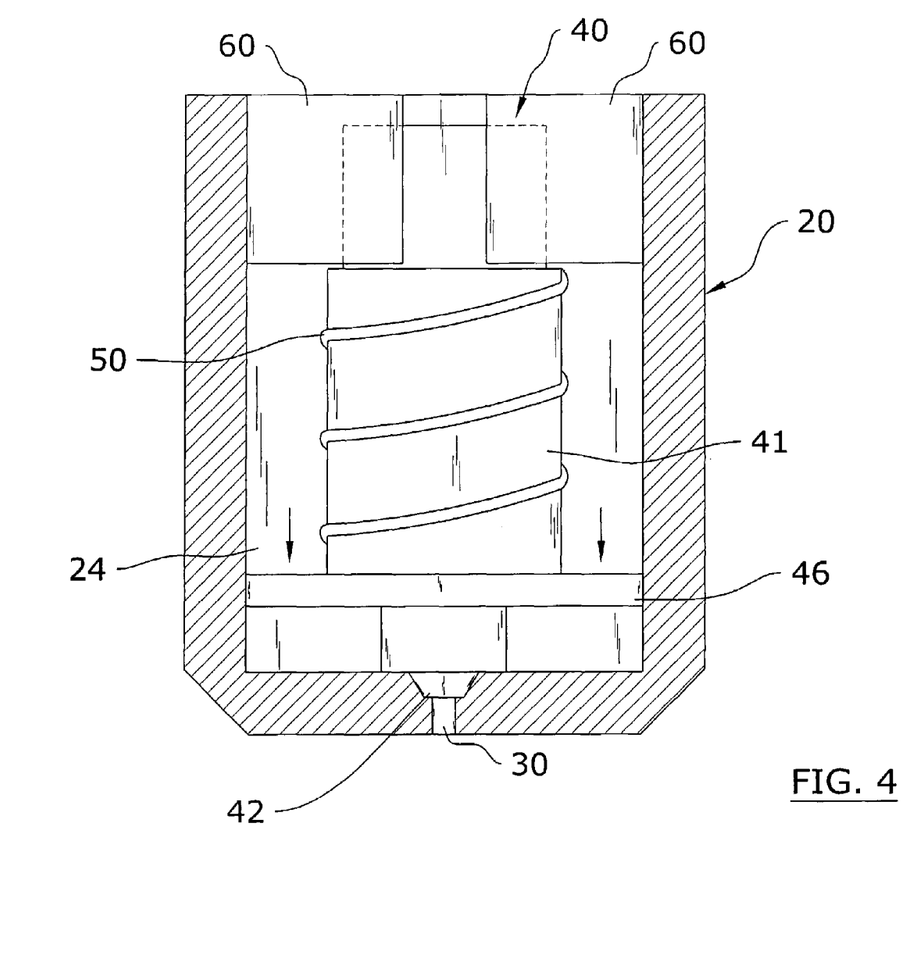
FIG. 4 is a cutaway side view of the present invention with the plunger in the closed position with respect to the orifice.
Figure 5:
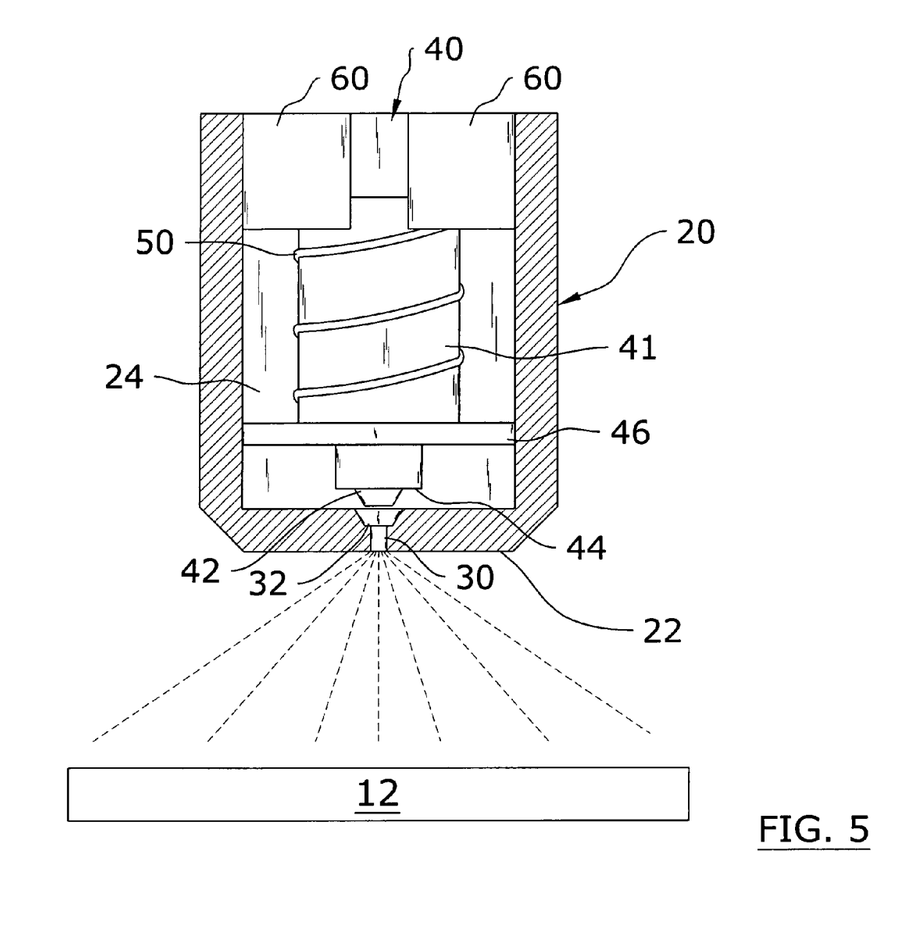
FIG. 5 is a cutaway side view of the present invention with the plunger in the open position thereby allowing the coolant to be sprayed upon the surface of the heat producing device.
Figure 6:
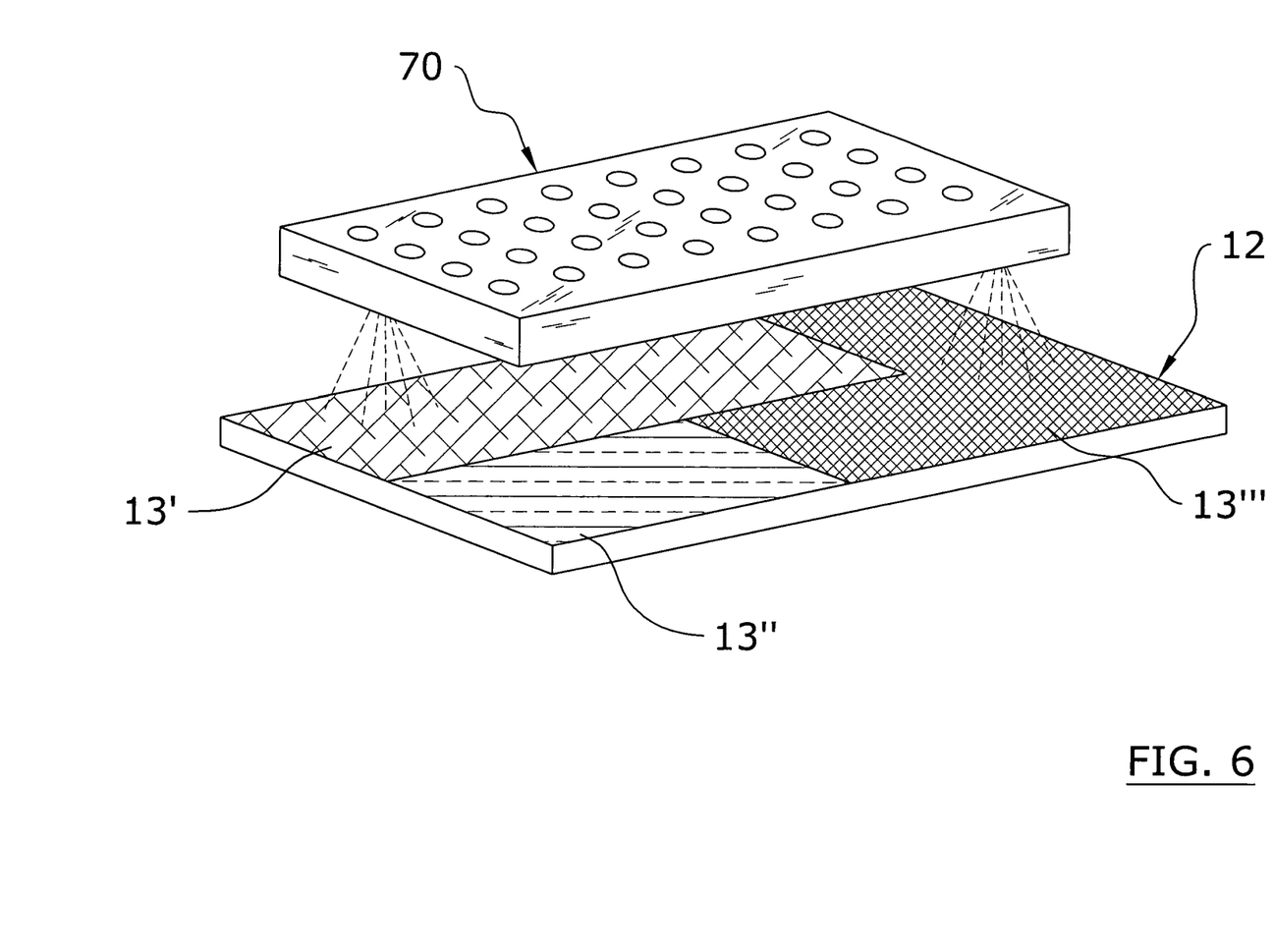
FIG. 6 is an upper perspective view of an array of atomizers of the present invention positioned above a heat producing device having a plurality of different heat flux zones.
Figure 7:
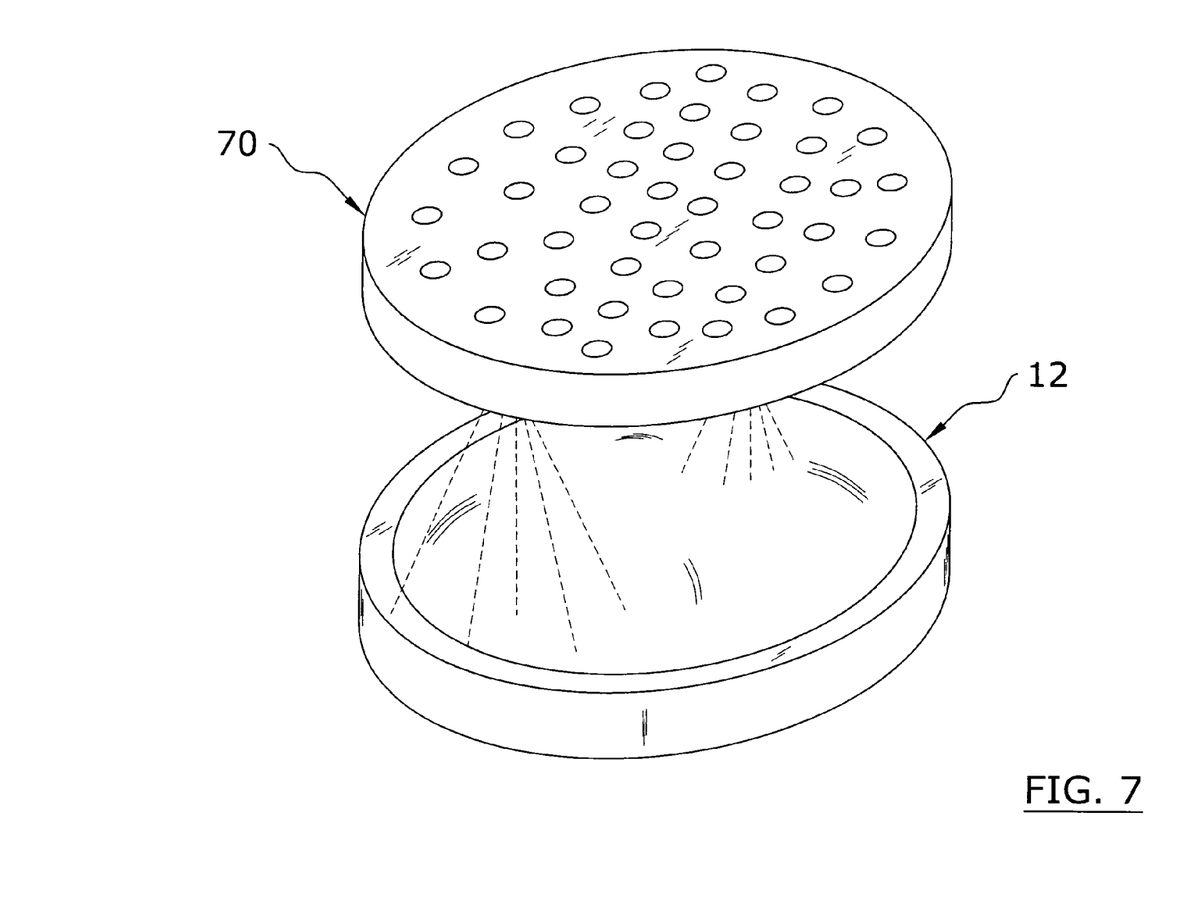
FIG. 7 is an upper perspective view of an array of atomizers of the present invention positioned above a heat producing device having an uneven surface.
Figure 8:
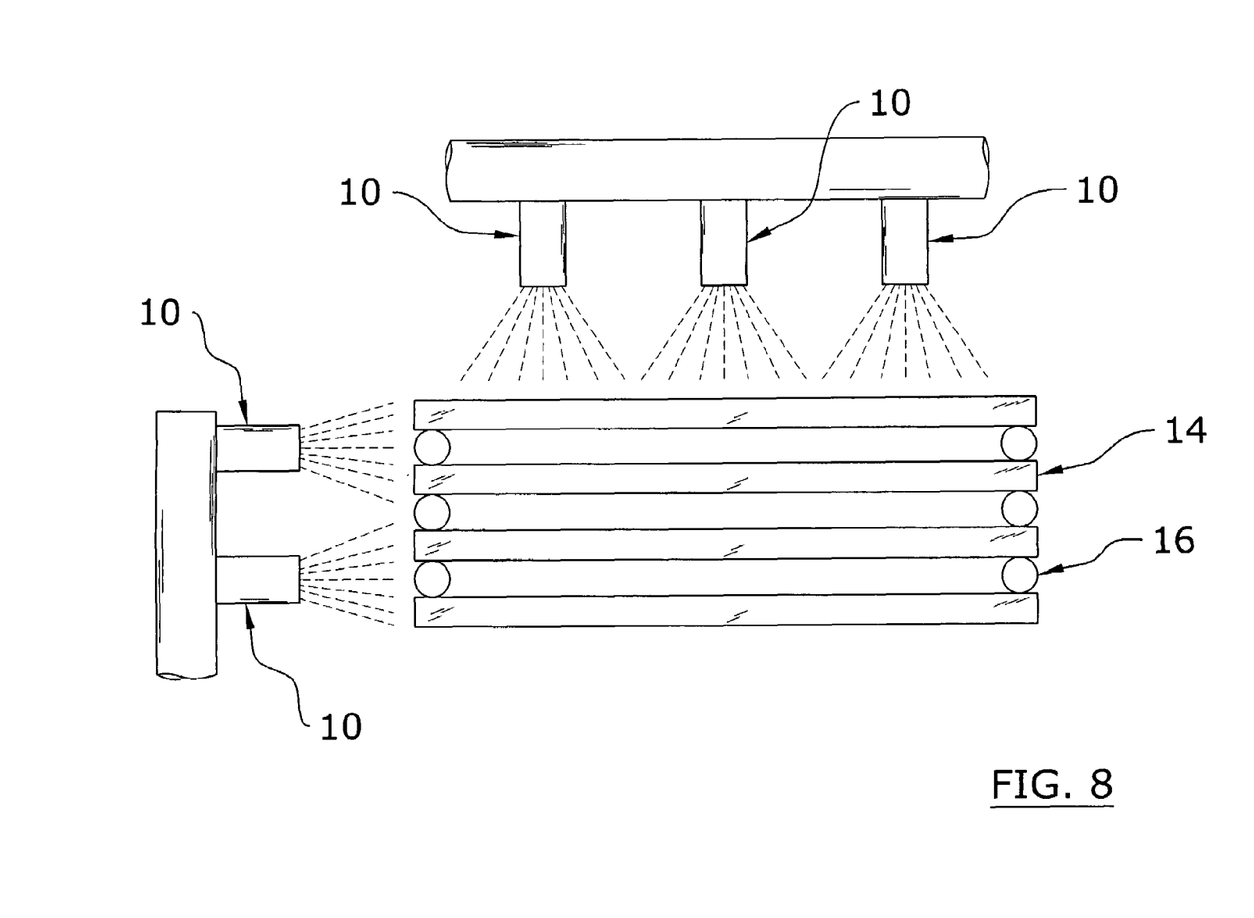
FIG. 8 is a side view of a chips scale package being thermally managed with an array of atomizers of the present invention.

Turning now descriptively to the drawings, in which similar reference characters denote similar elements throughout the several views, FIGS. 1 through 10 illustrate an atomizer 10 for a spray cooling thermal management system. It can be appreciated that even though FIGS. 1 through 5 illustrate a single atomizer 10 that the present invention may be embodied within an atomizer array 70 wherein a plurality of atomizers 10 may be utilized as shown in FIGS. 6 through 8 of the drawings. Each atomizer 10 comprises a housing 20 having a coolant passage 24 and a dispensing end 22, an orifice 30 within the dispensing end 22, and an actuator 40 manipulating a plunger 41 within the housing 20. The plunger 41 includes a head 42 that is sealable within a recessed portion 32 of the orifice 30 to open or close the orifice 30. The coolant passes through the coolant passage 24 into the orifice 30 for spraying upon a heat producing device 12. The actuator 40 may reciprocate so that the coolant spray emitted through the orifice 30 is pulsating. The pulsing frequency may be increased to increase cooling or decreased to decrease cooling of the heat producing device 12. Pulse rates in excess of ten thousand cycles per second have been demonstrated by the applicant.

B. Housing

The housing 20 may be comprised of various structures and configurations other than shown in FIGS. 1 through 5 of the drawings. For example, the housing 20 may be integrally formed within an array 70 as shown in FIGS. 6 through 8 of the drawings.

Figure 1:
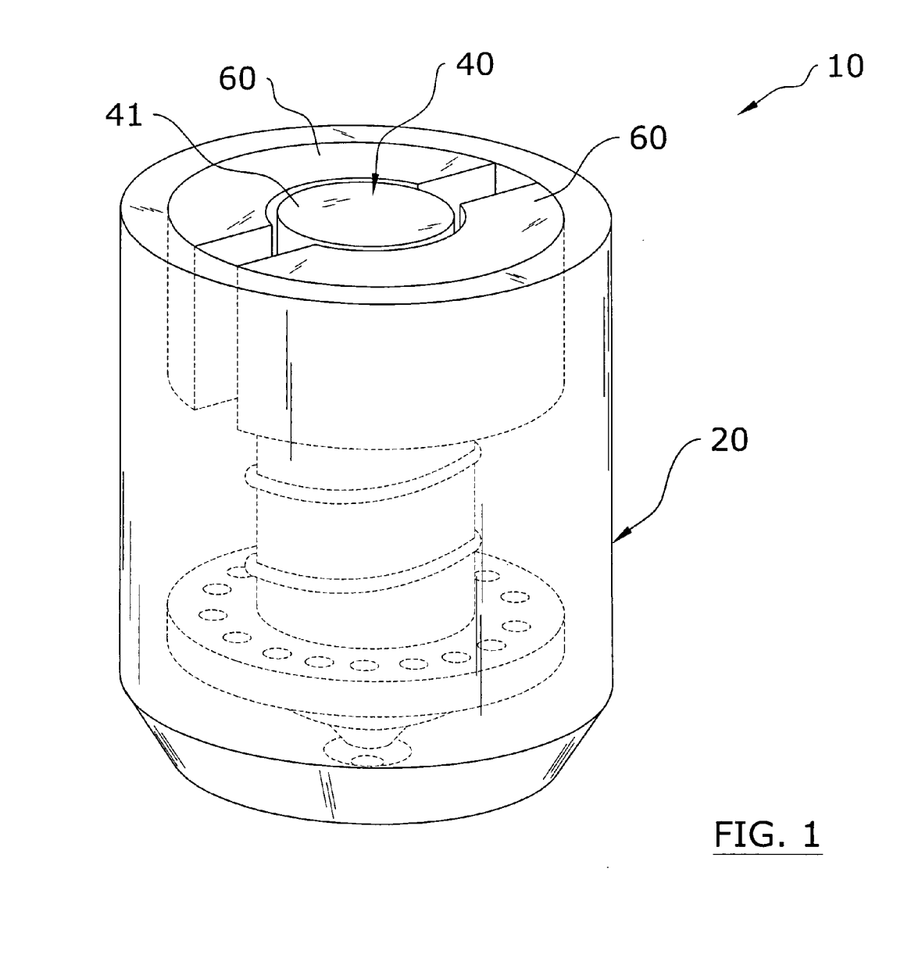
FIG. 1 is an upper perspective view of the present invention.
Figure 2:
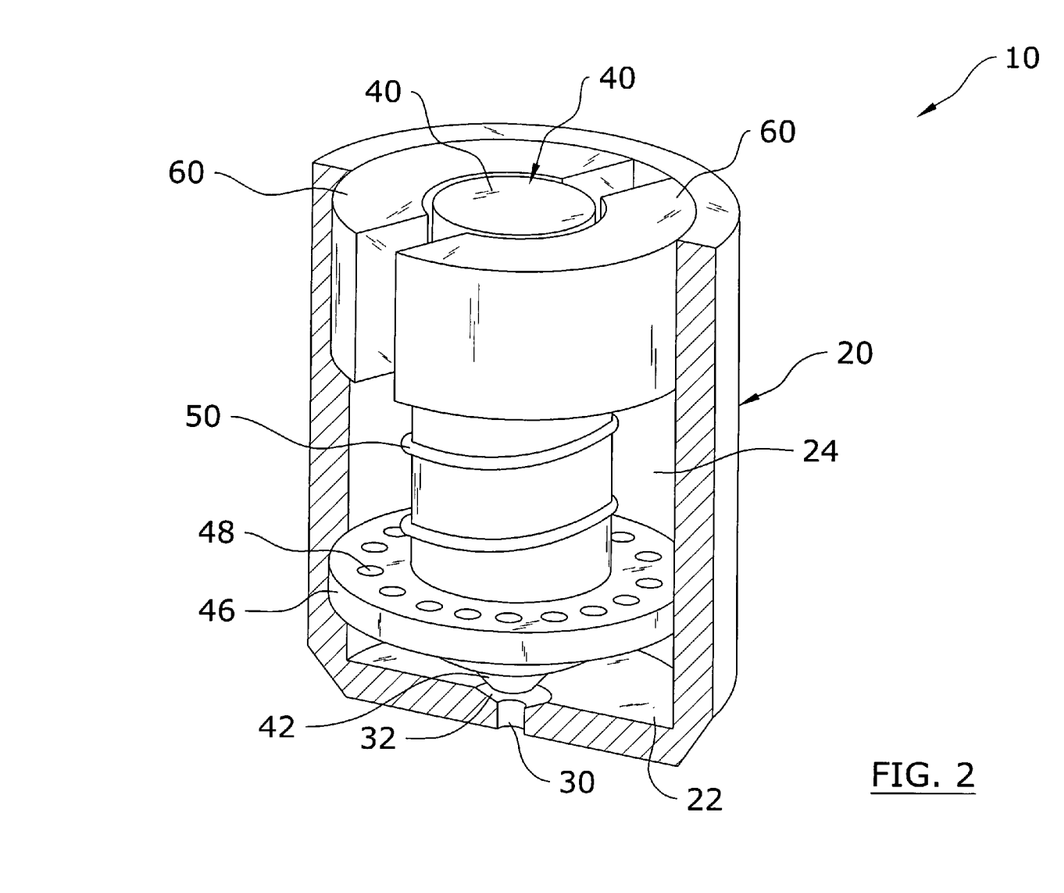
FIG. 2 is a cutaway upper perspective view of the present invention.
Figure 3:
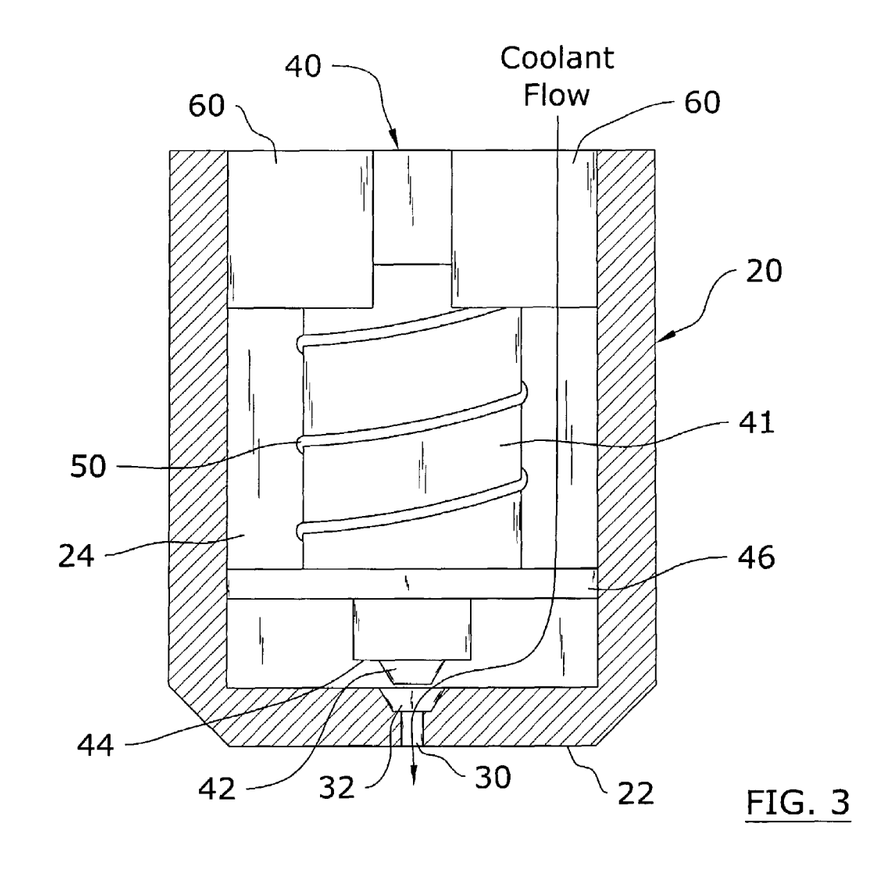
FIG. 3 is a cutaway side view of the present invention with the plunger in the open position with respect to the orifice.

As shown in FIGS. 2 through 5 of the drawings, the housing 20 includes at least one coolant passage 24 that allows for the passage of coolant to the orifice 30. The coolant passage 24 may have various cross sectional shapes (e.g. circular, square, oval) and lengths. The coolant passage 24 is preferably comprised of a relatively straight passage as shown in FIGS. 3 through 5 of the drawings.

Figure 9:
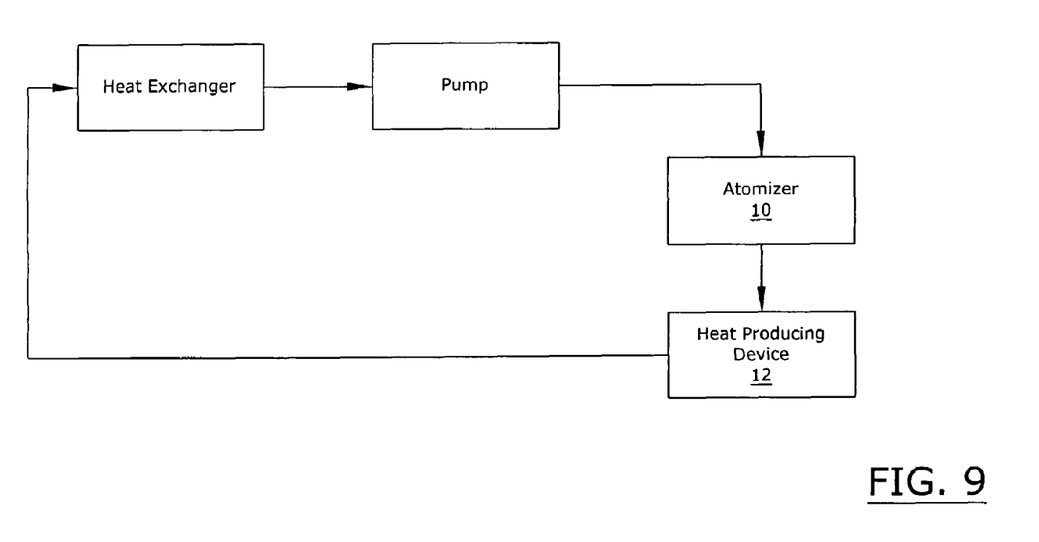
FIG. 9 is a block diagram of the present invention illustrating the coolant flow.

The coolant passage 24 is fluidly connectable to a conventional thermal management system as shown in FIG. 9 of the drawings. A conventional thermal management system typically has at least one pump fluidly connected to the atomizer 10 and a heat exchanger for thermally conditioning the coolant prior to entering the atomizer 10 as shown in FIG. 9 of the drawings.

C. Orifice

The orifice 30 is positioned within a dispensing end 22 of the housing 20 and is fluidly connected to the coolant passage 24 as shown in FIGS. 2 through 5 of the drawings. The orifice 30 may have various shapes (e.g. circular, square, oval) and sizes. The orifice 30 may be adjusted in shape and size depending upon the desired spray pattern and spray flow rate which is well know in the spray cooling industry. It can be appreciated that more than one orifice 30 may exist within the housing 20.

As shown in FIGS. 2 through 5 of the drawings, the orifice 30 preferably includes a recessed portion 32 facing the coolant passage 24 for receiving the head 42 of the passage in a sealed manner. The recessed portion 32 preferably receives at least a portion of the head 42 for closing the orifice 30 in a sealed manner.

The recessed portion 32 and the head 42 of the plunger 41 preferably have a substantially similar cross sectional shape (e.g. circular, oval, circular, square, rectangular) and size. As shown in FIGS. 2 through 5 of the drawings, the recessed portion 32 and the head 42 each preferably have a tapered structure (e.g. conical). The recessed portion 32 is preferably concentric with the orifice 30. The recessed portion 32 may have a cross sectional shape (e.g. circular, oval, circular, square, rectangular) similar to the orifice 30.

D. Plunger

At least one plunger 41 is connected to the actuator 40 as shown in FIGS. 1 through 5 of the drawings. If more than one orifice 30 is utilized within the housing 20, a corresponding number of plungers 41 may be utilized for controlling coolant flow through the respective orifices 30. Alternatively, a single plunger may control more than one orifice 30.

The plunger 41 includes a head 42 capable of closing the orifice 30 as shown in FIGS. 2 through 5 of the drawings. The head 42 is formed to have a shape and size similar to the recessed portion 32 of the orifice 30 to selectively form a seal for closing the orifice 30.

The plunger 41 preferably also includes an engaging surface 44 that extends outwardly from the head 42 for engaging an interior surface of the dispensing end 22 as shown in FIGS. 3 through 4 of the drawings. The engaging surface 44 is preferably substantially flat and straight to assist in sealing upon the interior surface of the dispensing end 22.

As shown in FIGS. 2 through 5 of the drawings, the plunger 41 is preferably substantially concentric with the coolant passage 24 and the orifice 30. The plunger 41 is preferably an elongated structure, though non-elongated structures may be utilized for the plunger 41. The plunger 41 may also have various shapes, sizes and structures capable of controlling the coolant flow through the orifice 30.

As shown in FIGS. 1 through 5 of the drawings, a guide member 46 is attached to the plunger 41 extending outwardly in a radial manner for slidably engaging the inner wall of the coolant passage 24. The guide member 46 also preferably includes one or more passages 48 for allowing the passage of coolant. The passages 48 may extend into an inner portion and/or an outer portion of the guide member 46. One or more passages 48 may provide directional control of the fluid, such as but not limited to creating swirling.

E. Actuator

The actuator 40 is connected to the plunger 41 for controlling the position of the plunger 41 with respect to the orifice 30. The actuator 40 is capable of applying an opening (or closing) force upon the plunger 41 for opening (or closing) the orifice 30.

The actuator 40 is preferably positioned at least partially within the coolant passage 24 in order to thermally manage the actuator 40 as shown in FIGS. 1 through 5 of the drawings. Since the coolant is typically a dielectric, the actuator 40 can be electro-mechanical and still positioned within the coolant passage 24. By positioning the actuator 40 within the coolant passage 24 the actuator 40 is thermally managed thereby allowing for an increased duty cycle for the actuator 40.

The actuator 40 may be comprised of various mechanisms capable of manipulating the plunger 41 (e.g. electro-mechanical, hydraulic). As shown in FIGS. 2 through 5 of the drawings, the actuator 40 is preferably comprised of a plurality of coils 60 that magnetically manipulate the plunger 41 along the longitudinal axis of the plunger 41. A bias member 50 is attached to the plunger 41 and the housing 20 to apply a closing (or opening) bias force to the plunger 41. When electricity is passed through the coils 60, a magnetic force is applied to the plunger 41 causing the plunger 41 to open (or close). The force applied by the coils 60 when activated is opposite of the force applied by the bias member 50.

F. Atomizer Array

FIGS. 6 and 7 illustrate a plurality of atomizers 10 collectively forming an atomizer array 70. The atomizer array 70 preferably has a plurality of zones that are individually controlled for providing varying thermal management capabilities to various heat flux zones 13 of the heat producing device 12. The plurality of atomizers may be individually controlled or controlled as a group to achieve a desired thermal management of the heat producing device 12. Atomizer array 70 may also be comprised of both conventional atomizers and one or more atomizer 10.

FIG. 7 illustrates the atomizer array 70 utilized to thermally manage a heat producing device 12 having an uneven cooling surface. FIG. 8 illustrates a plurality of atomizer arrays 70 thermally managing a chips scale package having a plurality of silicon dies 14 connected by a plurality of solder balls 16 (or similar connectors). Typically, solder balls 16 provide a heat conduction path between the plurality of silicon dies 14. As shown in FIG. 8 of the drawings, the atomizers 10 may spray directly upon the outer silicon die 14 and/or from the side directly upon the solder balls 16, thus providing thermal control of the overall package. Maintaining even and consistent temperatures across silicon dies 14 and solder balls 16 provides the means of reducing thermal stresses and increasing package reliability.

G. Control Unit

Figure 10:
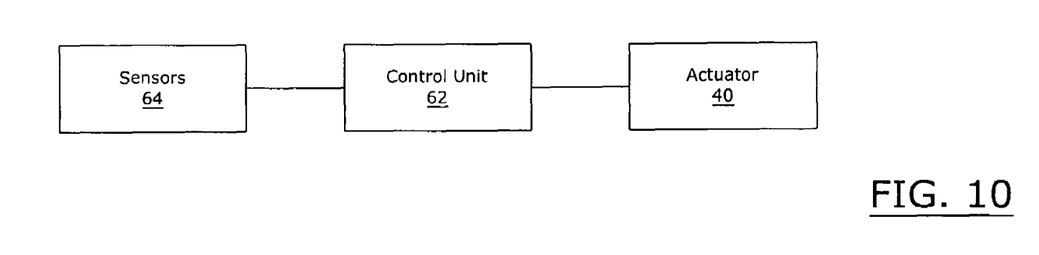
FIG. 10 is a block diagram of the present invention illustrating the communications between the various components of the present invention.

The control unit 62 is in communication with the actuator 40 (or actuators 40 of the atomizer array 70) as shown in FIG. 10 of the drawings. The control unit 62 preferably cycles the actuator 40 to achieve a desired flow rate through the orifice 30. The control unit 62 is able to control the amount of time that the orifice 30 is open and closed, without creating non-optimal droplet flow characteristics.

At least one sensor is preferably in communication with the control unit 62 for monitoring a state of a heat producing device 12. For example, the sensor could monitor the temperature and heat flux of various heat flux zones 13 to determine the thermal management requirements of each individual heat flux zones 13. The sensor can also monitor the coolant temperature prior to being emitted through the orifice 30 and after thermally managing the heat producing device 12. With usage of sensors 64, automatic and semi-automatic control of the atomizers 10 may be achieved.

H. Operation of Invention

In use, the control unit 62 determines the thermal management requirements of one or more heat flux zones 13 of the heat producing device 12. For heat flux zones 13 that require additional thermal management, the control unit 62 increases the flow rate of coolant through the atomizers 10 that correspond with these heat flux zones 13. The coolant flow rate may be increased by increasing the period of time that the orifice 30 is open. If a heat flux zone is experiencing flooding or requires less thermal management, the coolant flow rate may be decreased by decreasing the period of time that the orifice 30 is open. The control unit 62 preferably cycles the actuator 40 to create a pulsing effect of the spray emitted from the orifice 30. The control unit 62 may completely close or open various atomizers 10 depending upon the thermal management requirements. FIG. 3 illustrates the plunger 41 in the open position wherein a gap exists between the head 42 and the recessed portion 32 of the orifice 30 which allows for the passage of the coolant through the orifice 30. FIG. 4 illustrates the plunger 41 in the closed position wherein the head 42 is sealed within the recessed portion 32 of the orifice 30 thereby preventing the passage of the coolant through the orifice 30.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims (and their equivalents) in which all terms are meant in their broadest reasonable sense unless otherwise indicated. Any headings utilized within the description are for convenience only and have no legal or limiting effect.

We claim:

1. A thermal management system comprising:
    a heat producing device;
    at least one atomizer comprising:
        a housing having a coolant passage,
        an orifice within a dispensing end of said housing fluidly connected to said coolant passage, wherein said orifice directs liquid coolant towards said heat producing device for thermally managing said heat producing device,
        an actuator, and
        a plunger connected to said actuator, wherein said plunger includes a head capable of closing said orifice;
    a control unit in communication with said actuator, wherein said control unit controls said actuator to achieve a desired flow rate of liquid coolant through said orifice;
    at least one sensor in communication with said control unit, wherein said at least one sensor monitors a temperature of said heat producing device.

2. The thermal management system of claim 1, wherein said orifice includes a recessed portion facing said coolant passage, wherein said recessed portion receives at least a portion of said head for closing said orifice.

3. The thermal management system of claim 2, wherein said recessed portion and said head have a substantially similar cross sectional shape and size.

4. The thermal management system of claim 3, wherein said recessed portion and said head each have a tapered structure.

5. The thermal management system of claim 3, wherein said recessed portion and said head each have a conical structure.

6. The thermal management system of claim 3, wherein said recessed portion and said head each have a tapering structure having a circular cross section.

7. The thermal management system of claim 2, wherein said recessed portion is concentric with a longitudinal axis of said orifice.

8. The thermal management system of claim 2, wherein said recessed portion has a cross sectional shape similar to said orifice.

9. The thermal management system of claim 2, wherein said plunger includes an engaging surface that extends outwardly from said head for engaging an interior surface of said dispensing end.

10. The thermal management system of claim 1, wherein said plunger is substantially concentric with said coolant passage.

11. The thermal management system of claim 1, wherein said plunger is substantially concentric with said orifice.

12. The thermal management system of claim 1, wherein said actuator is positioned at least partially within said coolant passage.

13. The thermal management system of claim 1, wherein said actuator is electro-mechanical.

14. The thermal management system of claim 1, wherein said actuator is comprised of a plurality of coils that magnetically manipulate said plunger and a bias member attached to said plunger.

15. The thermal management system of claim 14, including a guide member attached to said plunger in a radial manner and wherein said guide member slidably engages an inner wall of said coolant passage.

16. The thermal management system of claim 15, wherein said guide member includes one or more passages for allowing the passage of coolant.

17. The thermal management system of claim 1, wherein said at least one atomizer is comprised of a plurality of atomizers forming an atomizer array.

18. The thermal management system of claim 17, wherein said atomizer array has a plurality of zones that are individually controlled.

19. The thermal management system of claim 17, wherein said plurality of atomizers are individually controlled.

20. A thermal management system comprising:
    a heat producing device;
    at least one atomizer comprising:
        a housing having a coolant passage,
        an orifice within a dispensing end of said housing fluidly connected to said coolant passage, wherein said orifice directs liquid coolant towards said heat producing device for thermally managing said heat producing device,
        an actuator,
        a plunger connected to said actuator, wherein said plunger includes a head capable of closing said orifice;
    a control unit in communication with said actuator, wherein said control unit cycles said actuator to achieve a desired flow rate of liquid coolant through said orifice;
    at least one sensor in communication with said control unit, wherein said at least one sensor monitors a temperature of said heat producing device;
    wherein said actuator operates at a pulsing frequency, wherein said control unit increases said pulsing frequency to increase cooling of said heat producing device or decreases said pulsing frequency to decrease cooling of said heat producing device.

21. The thermal management system of claim 20, wherein said pulsing frequency has a range of at least ten thousand cycles per second.

22. A thermal management system comprising:
   a heat producing device;
   at least one atomizer comprising:
      a housing having a coolant passage,
      an orifice within a dispensing end of said housing fluidly connected to said coolant passage, wherein said orifice directs liquid coolant towards said heat producing device for thermally managing said heat producing device,
      an actuator,
      a plunger connected to said actuator, wherein said plunger includes a head capable of closing said orifice;
   a control unit in communication with said actuator, wherein said control unit controls said actuator to achieve a desired flow rate of liquid coolant through said orifice;
   at least one sensor in communication with said control unit, wherein said at least one sensor monitors a temperature of said heat producing device;
   wherein said actuator is controlled to increase a flow rate of liquid coolant if a temperature of said heat producing device exceeds a first predetermined temperature and wherein said actuator is controlled to decrease a flow rate of liquid coolant if a temperature of said heat producing device is below a second predetermined temperature.

23. The thermal management system of claim 22, wherein said pulsing frequency has a range of at least ten thousand cycles per second.

* * * * *